(12) United States Patent
Khusnatdinov et al.

(10) Patent No.: US 11,249,397 B2
(45) Date of Patent: Feb. 15, 2022

(54) METHOD OF FORMING A CURED LAYER BY CONTROLLING DROP SPREADING

(71) Applicant: CANON KABUSHIKI KAISHA, Tokyo (JP)

(72) Inventors: Niyaz Khusnatdinov, Round Rock, TX (US); Timothy Brian Stachowiak, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 278 days.

(21) Appl. No.: 16/692,838

(22) Filed: Nov. 22, 2019

(65) Prior Publication Data

US 2021/0157236 A1    May 27, 2021

(51) Int. Cl.
*G03F 7/16*      (2006.01)
*G03F 7/095*     (2006.01)
*G03F 7/00*      (2006.01)
*B29C 59/02*     (2006.01)

(52) U.S. Cl.
CPC ............ *G03F 7/161* (2013.01); *G03F 7/0002* (2013.01); *G03F 7/095* (2013.01); *B29C 2059/023* (2013.01)

(58) Field of Classification Search
None
See application file for complete search history.

(56) References Cited

U.S. PATENT DOCUMENTS

| | | | |
|---|---|---|---|
| 6,162,745 A | 12/2000 | Ito et al. | |
| 6,450,635 B1 | 9/2002 | Okabe | |
| 7,020,355 B2 | 3/2006 | Lahann et al. | |
| 8,133,427 B2 | 3/2012 | Tada | |
| 8,178,026 B2 | 5/2012 | Okinaka et al. | |
| 9,034,429 B2* | 5/2015 | Bryan-Brown | G03F 7/0002 427/258 |
| 9,201,990 B2 | 12/2015 | Wakamatsu et al. | |
| 2009/0085255 A1* | 4/2009 | Tada | G11B 5/855 264/401 |
| 2016/0056036 A1 | 2/2016 | Tokue et al. | |
| 2016/0160003 A1 | 6/2016 | Kitagawa | |
| 2017/0068159 A1* | 3/2017 | Khusnatdinov | G03F 7/0002 |
| 2017/0283632 A1* | 10/2017 | Chiba | G03F 7/0002 |

FOREIGN PATENT DOCUMENTS

| | | |
|---|---|---|
| JP | 2001-074928 A2 | 3/2001 |
| JP | 2003-209339 A | 7/2003 |
| JP | 2003-295428 A | 10/2003 |
| JP | 2008-100378 A | 5/2008 |
| JP | 2009-083172 A | 4/2009 |
| JP | 5446782 B2 | 3/2014 |
| JP | 5516224 B2 | 6/2014 |
| JP | 5533297 B2 | 6/2014 |

* cited by examiner

*Primary Examiner* — James M Mellott
(74) *Attorney, Agent, or Firm* — Abel Schillinger, LLP

(57) ABSTRACT

A method of forming a cured layer on a substrate can include applying on the exterior surface of the substrate a first liquid film and subjecting the first liquid film to actinic radiation in at least one first region of the film. The actinic radiated region can modify the substrate surface such that the drop spreading of a region not subjected to actinic radiation is larger than the drop spreading in a region subjected to actinic radiation.

20 Claims, 11 Drawing Sheets

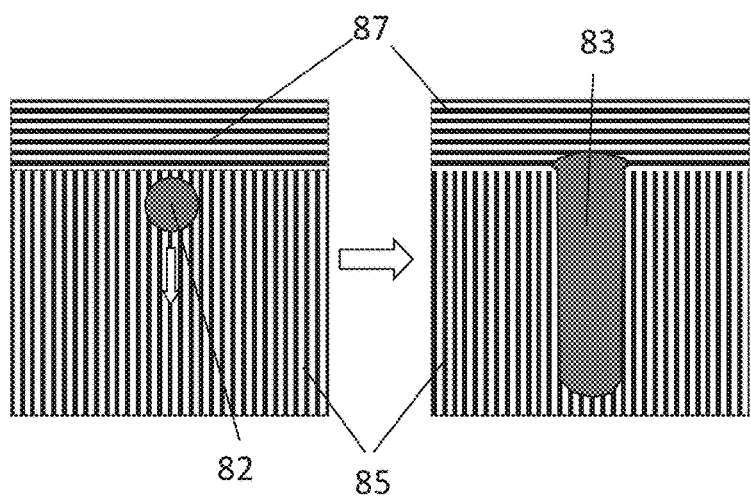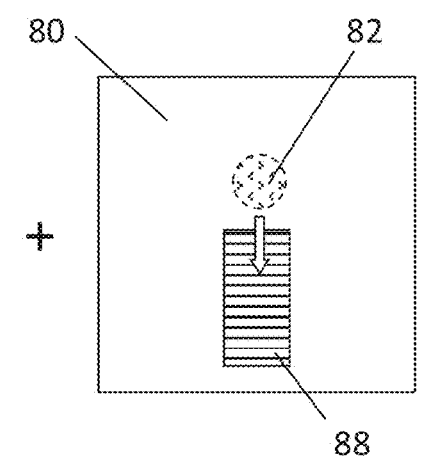
FIG. 8A        FIG. 8B        FIG. 8C

METHOD OF FORMING A CURED LAYER BY CONTROLLING DROP SPREADING

FIELD OF THE DISCLOSURE

The present disclosure relates to a method of forming a cured layer on a substrate, particularly to a method of controlling drop spreading when forming a cured layer in a nanoimprint lithographic process.

BACKGROUND

In imprint lithography, speeding up resist drop spreading before an imprint template touches the drops is used to increase the throughput of an imprint process, to reduce the amount of defects, and to achieve better residual layer uniformity. One way to facilitate the drop spreading is applying a pre-coating, which allows an increase of the drop spreading of an imprint resist material.

Accelerated resist spreading on the surface of a substrate can be challenging, however, if there are different requirements for the amount of resist volume across the substrate surface. For example, areas with different pattern density require different resist volumes: an area having a high pattern density requires more resist volume than an area with a lower pattern density. Sometimes, the spread and flow of the imprint resist in a preferred direction is desired. Furthermore, the imprint resist should ideally not cross certain boundary regions of an imprint field and not be outside a defined imprint area. The presence of unwanted resist in a boundary region is called resist leaking, which can lead to the forming of extrusions that are not desired and can have disadvantages for following process steps.

There exists a need for more flexibility in the drop spreading of an imprint resist material.

SUMMARY

In one embodiment, a method of forming a cured layer on a substrate can comprise: applying a first liquid curable composition as a first film overlying an exterior surface of a substrate; subjecting at least one first region of the first film to a first actinic radiation, wherein the first actinic radiation causes at least a partial curing of the first liquid curable composition in the at least one first region; depositing droplets of a second liquid curable composition on the first film, wherein a drop spreading of the droplets is different within the at least one first region of the first film subjected to the first actinic radiation compared to at least one second region of the first film not subjected to the first actinic radiation; contacting the droplets deposited on the first film with a template or a superstrate to further spread and merge the droplets to a second film on the exterior surface of the substrate; applying a second actinic radiating on the second film and curing the second film to form the cured layer; and removing the template or superstrate from the cured layer.

In one aspect of the method, at least a portion of the droplets of the second curable composition can spread anisotropically along the first film overlying the exterior surface of the substrate.

In another aspect of the method, the first film can be fluid when depositing the droplets of the second liquid curable composition on the first film.

In a further aspect of the method, the first actinic radiation of the first film can be applied through a mask containing a radiation pattern to form a plurality of at least partially cured first regions of the first film according to the radiation pattern.

In yet a further embodiment of the method, a viscosity of the first liquid curable composition may be in a range from 1 mPa·s to 200 mPa·s.

In another aspect of the method, the first actinic radiation can be light with a wavelength in a range from 250 nm to 450 nm.

In another aspect of the method, before depositing the droplets of the second curable composition on the first film, a surface tension ratio SE1:SE2 can be at least 1.1, with SE1 being a surface tension of the at least one first region of the first film subjected to the first actinic radiation, and SE2 being a surface tension of the at least one second region of the first film not subjected to the first actinic radiation.

In another aspect of the method, before depositing the droplets of the second curable composition on the first film, a viscosity ratio SV1:SV2 can be at least 1.2, with SV1 being a viscosity of the at least one first region of the first film subjected to the first actinic radiation, and SV2 being a viscosity of the at least one second region of the first film not subjected to the first actinic radiation.

In one aspect, the surface tension of the second curable composition can be lower than the surface tension of the first curable composition.

In another aspect of the method, the first liquid curable composition can comprise acrylate monomers.

In a further aspect of the method, a drop spreading diameter ratio SD2:SD1 can be at least 1.3, with SD2 being an average drop spreading diameter of drops deposited on the first film in the at least one second region not subjected to the first actinic radiation, and SD1 being an average drop spreading diameter of drops deposited on the at least one first region of the first film subjected to the first actinic radiation.

In another aspect, the method can further comprise applying an adhesion layer between the exterior surface of the substrate and the first film.

In yet a further aspect of the method, the viscosity of the second liquid curable composition can be not greater than 50 mPa·s.

In one embodiment, the method is adapted for nanoimprint lithography and the second liquid curable composition can be an imprint resist.

In another embodiment of the method, the droplets deposited on the first film can be contacted with a template, wherein after removal of the template the cured layer can comprises at least one imprint region and at least one boundary region, wherein a location of the at least one imprint region on the substrate corresponds to the at least one first region of the first film subjected to the first actinic radiation, and a location of the at least one boundary region corresponds to the at least one second region of the first film not subjected to the first actinic radiation.

In another aspect of the method, the cured layer can include at least two imprint regions and at least two boundary regions. In one aspect, the at least two imprint regions and at least two boundary regions can be arranged in alternating order. In a further aspect, the at least two imprint regions can form a plurality of lines and the boundary regions can be arranged between the lines of the imprint regions.

In another embodiment, a method of forming an article can comprise: applying a first liquid curable composition as a first film overlying an exterior surface of a substrate; subjecting at least one first region of the first film to a first actinic radiation, wherein the first actinic radiation causes at least a partial curing of the first liquid curable composition in the at least one first region; depositing droplets of an imprint resist on the first film, wherein an average spreading diameter of the droplets is different within the at least one first region of the first film subjected to actinic radiation compared to at least one second region of the first film not subjected to the first actinic radiation, contacting the droplets deposited on the first film with a template to further spread and merge the droplets to a second film on the exterior surface of the substrate; subjecting the second film to a second actinic radiation and curing the second film to form a cured layer; removing the template from the cured layer, wherein after removal of the template the cured layer comprises at least one imprint region and at least one boundary region, wherein a location of the at least one imprint region on the substrate corresponds to the at least one first region of the first film subjected to the first actinic radiation, and a location of the at least one boundary region corresponds to the at least one second region of the first film not subjected to the first actinic radiation; and processing the substrate with the cured layer to make the article. In one aspect, the method can be adapted for nanoimprint lithography and the second liquid curable composition may be an imprint resist.

BRIEF DESCRIPTION OF THE DRAWINGS

Embodiments are illustrated by way of example and are not limited in the accompanying figure.

FIG. 8A illustrates a top view of a deposited resist drop on a pre-treated substrate according to one embodiment.

FIG. 8B illustrates a top view after spreading of the resist drop shown in FIG. 8A according to one embodiment.

FIG. 8C illustrates a top view of a template designed for being applied on the spread resist drop of FIG. 8B according to one embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a method of forming a cured layer on a substrate, wherein the exterior surface of the substrate has been modified, such that when depositing droplets of a curable composition on the exterior surface of the substrate, the droplet spreading is different in at least two regions of the exterior surface of the substrate.

Figure 1:
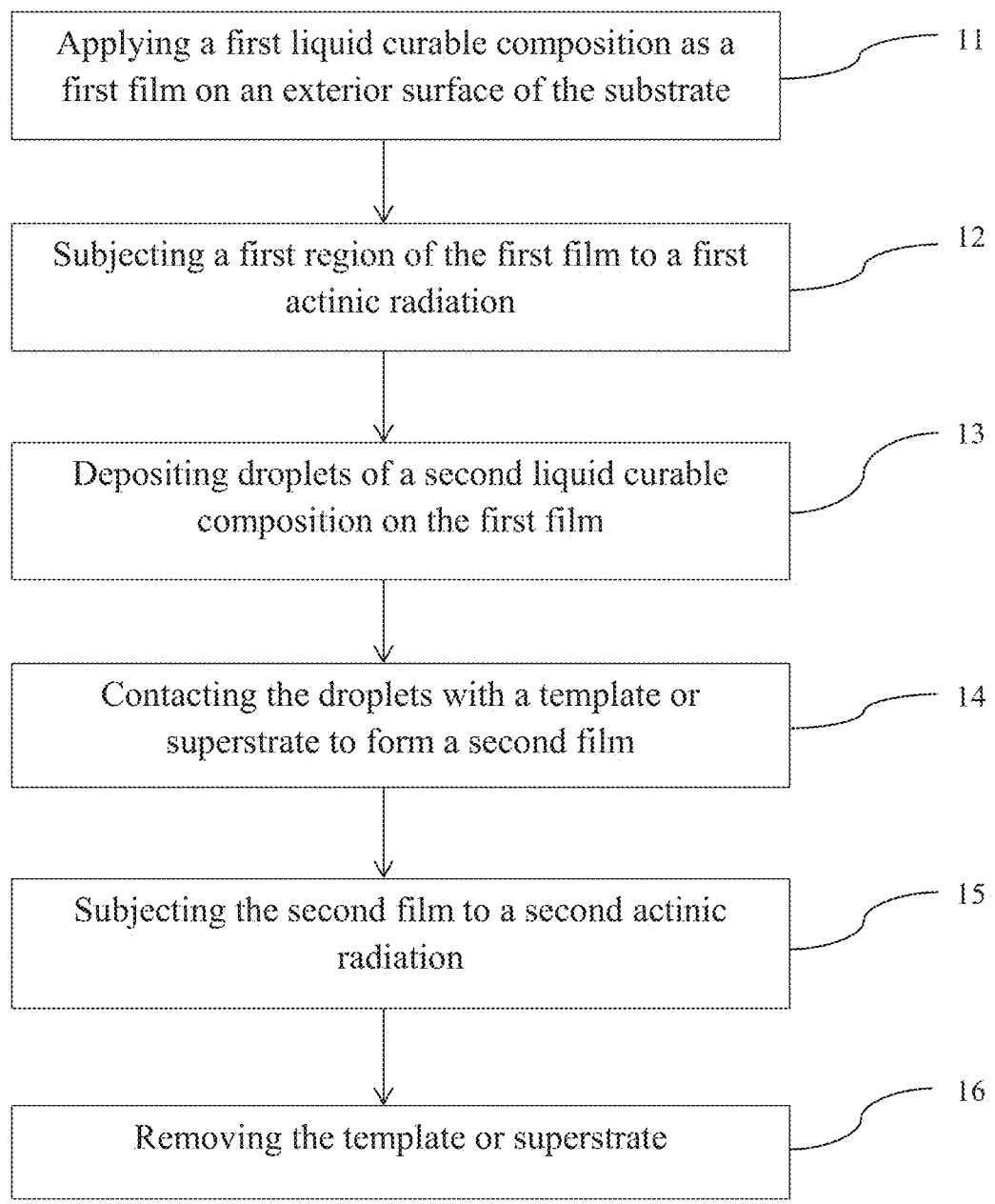
FIG. 1 includes a scheme describing a method of forming a cured layer according to one embodiment.

In one embodiment, as also illustrated in FIG. 1, the method can comprise the following steps: 11) applying a first liquid curable composition as a first film on an exterior surface of the substrate; 12) subjecting at least one region of the first film to a first actinic radiation, thereby causing at least a partial curing of the radiated film region; 13) depositing droplets of a second liquid curable composition on the first film; 14) contacting the droplets deposited on the first film with a template or superstrate to further spread and merge the droplets to a second film; 15) actinic radiating and curing the second film; and 16) removing the template or superstrate from the cured layer.

In one embodiment, the substrate can be a wafer. Non-limiting materials of the substrate can be silicon, fused silica, quartz, silicon germanium, gallium arsenide, indium phosphide, silicon carbide, or silicon nitride.

In a particular embodiment, the substrate can include an adhesion layer overlying an exterior surface of the substrate, and the first film can be directly applied on the adhesion layer. The presence of the adhesion layer can increase the adhesion of one or more further applied cured polymeric layer(s). As used herein, the term substrate is intended to mean both options, a substrate without an adhesion layer or a substrate including an adhesion layer, unless indicated otherwise.

The first liquid curable composition applied as a first film on the substrate can include a polymerizable material which is sensitive to actinic radiation and can be cured in a controlled manner, such that properties like degree of polymerization, viscosity, and surface tension can be adjusted to influence the spreading behavior of the droplets of the second curable composition applied on the first film.

Figure 2A:
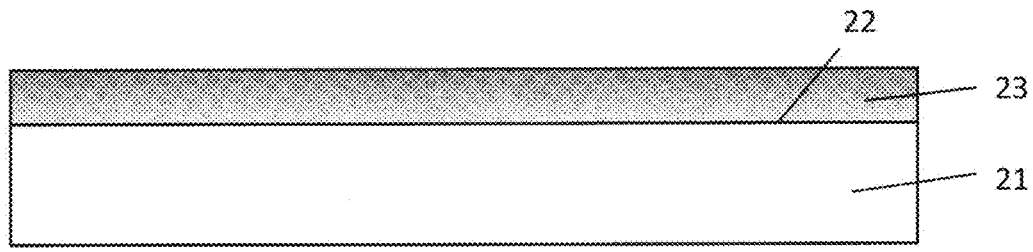
FIG. 2A illustrates a side view of a substrate including a first film according to one embodiment.
Figure 2B:
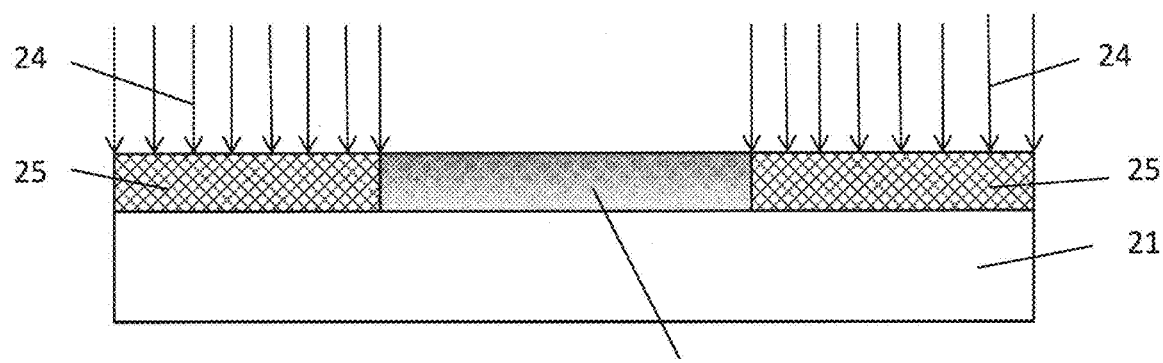
FIG. 2B illustrates a side view of the substrate shown in FIG. 2A, which is further subjected to a first actinic radiation according to one embodiment.
Figure 2C:
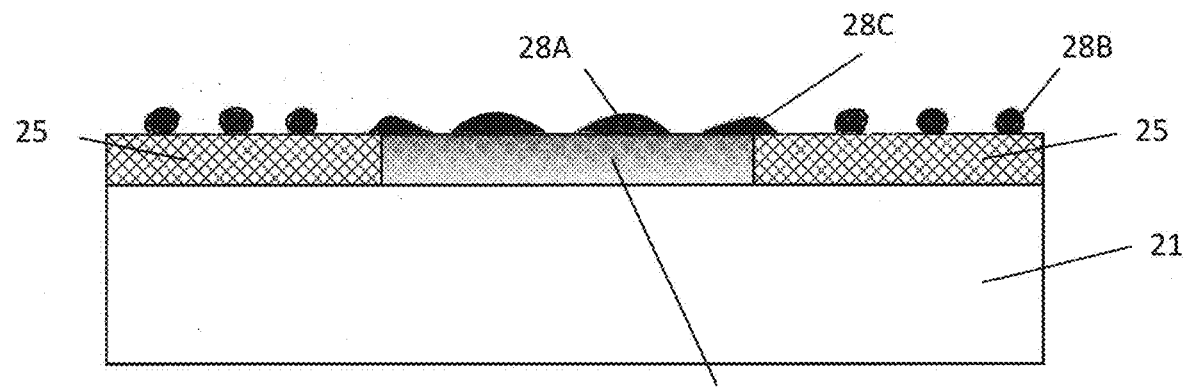
FIG. 2C illustrates a side view of the substrate shown in FIG. 2B, and further illustrates deposited resist drops according to one embodiment.

An embodiment of the method of the present disclosure is illustrated in FIGS. 2A-2D. A substrate (21) can be coated on an exterior surface (22) with a first liquid film (23) (see FIG. 2A). Actinic radiation (24) may be applied through a mask (not shown) on the first liquid film (23) at first regions (25) and blocked in second regions (26) of the film (see FIG. 2B). The actinic radiation (24) may cause a partial curing of the first film (23) in the first regions (25) and thereby changing the viscosity, and surface tension properties of the first film in these regions. As illustrated in FIG. 2C, a second curable composition (e.g., an imprint resist) can be deposited in form of precisely placed drops (28A, 28B, and 28C) on the first regions (25) and on the second regions (26) of the first film (23), wherein the deposited drops can have a different drop spreading behavior within the first regions (25) and within the second regions (26). The drops 28B deposited on the first regions (25) can have a lower drop diameter than the drops 28A deposited on the second region (26). If drops are deposited at a position which covers the first regions (25) and the second region (26), such drops (28C) may spread anisotropically, flowing more towards the second region (26) than towards the first region (25).

Figure 2D:
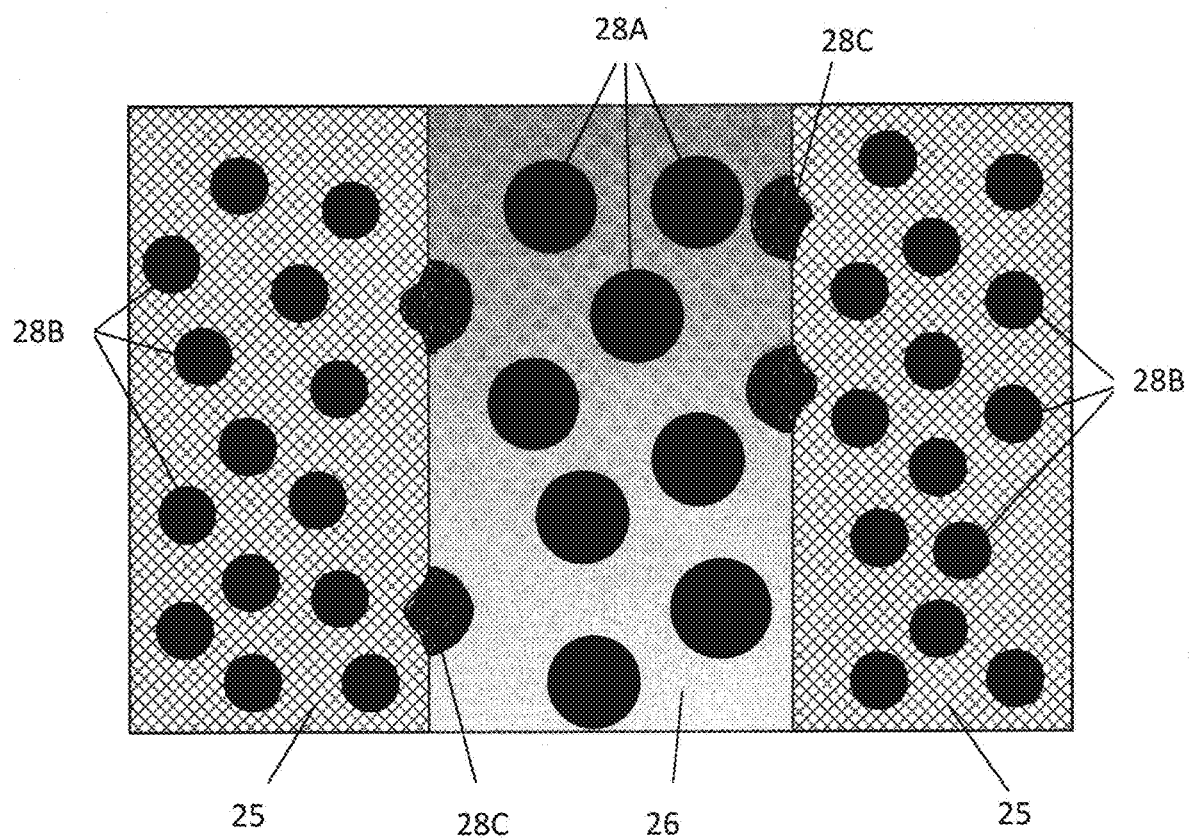
FIG. 2D illustrates a top view of the embodiment shown in FIG. 2C.

FIG. 2D illustrates a top view of the substrate shown in FIG. 2C. It can be seen that the drops (28B) deposited in the first region (25) have a smaller spreading diameter than drops (28A) deposited within the second region (26). It can be further seen that at the border lines between first regions (25) and the second region (26), the drops do not spread isotropically as within the first or second regions, but have an anisotropical spreading behavior, spreading more in the direction of the second region (26) than towards the first region (25).

The drop spreading of the second curable composition can involve an intermixing of the drops with first film, since the first film can be still in a liquid stage when the drops of the second curable composition are deposited. In one aspect, the intermixing ability of the first film with the deposited drops of the second curable composition can be influenced by the actinic radiation of the first film, such that the intermixing ability may be lower in the first regions of the first film subjected to actinic radiation than in the second regions of the first film not subjected to actinic radiation. In a particular aspect, if a region of the first film is fully cured and transformed by the actinic radiation to a highly viscous or solid stage, a very limited or no intermixing with the deposited drops in such region may happen.

The first liquid curable composition which is applied on the substrate as a first film can include polymerizable monomers, polymerizable oligomers, polymerizable polymers, or any combination thereof. In addition, the first liquid curable composition can include optional additives, for example, photoinitiators, surfactants, and/or solvents. In a particular non-limiting aspect, the first liquid curable composition can include acrylate monomers or methacrylate monomers. Other non-limiting examples of first curable compositions are described, for example, in US 2018/0272634, which is expressly incorporated by reference herein.

The first film (23) can be applied on the substrate in any suitable manner. In a particular embodiment, the first film (23) can be applied by spin-coating.

In a particular embodiment, the first liquid curable composition can have a low viscosity to facilitate forming of a thin and homogeneous film on the substrate. A low viscosity can also be of advantage to facilitate the spreading of drops of the second curable composition on the first liquid film and intermixing with the first curable composition. In one aspect, the viscosity of the first curable composition can be not greater than 200 mPa·s, such as not greater than 100 mPa·s, or not greater than 50 mPa·s, or not greater than 30 mPa·s, or not greater than 20 mPa·s, or not greater than 15 mPa·s, or not greater than 12 mPa·s, or not greater than 10 mPa·s. In another aspect, the viscosity of the first curable composition can be at least 1 mPa·s, or at least 3 mPa·s, or at least 5 mPa·s.

In a particular aspect, the thickness of the first film can be at least 1 nm, or at least 3 nm, or at least 5 nm, or at least 10 nm. In another particular aspect, the thickness of the first film may be not greater than 100 nm or not greater than 50 nm, or not greater than 30 nm, or not greater than 20 nm, or not greater than 10 nm.

The first actinic radiation 24 can be light with a wavelength between 250 nm to 760 nm. In a preferred aspect, the actinic radiation may have a wavelength between 300 nm and 450 nm. In other aspects, the actinic radiation can be near infrared radiation (760 nm-2500 nm) and middle infrared radiation (2500 nm-8000 nm). The light intensity and dosing of the first actinic radiation (24) can be adjusted such that the first liquid film formed by the first curable composition may only partially be cured to obtain certain desired material and surface properties within the radiated regions (25).

In a particular aspect, the actinic radiation can be applied on the first film (23) through a mask having a pattern. In one aspect, the pattern of the mask can correspond to a pattern of a later applied template when forming a second liquid film.

The surface tension of the first curable composition can exceed the surface tension of the second curable composition. As used herein, the surface tension is defined as the interfacial surface energy between the curable composition and air. In a certain embodiment, the surface tension of the first curable composition can be in a range of 25 mN/m and 60 mN/m, and the surface tension of the second curable composition may be between 20 mN/m to 50 mN/m. The difference between the surface tension of the first liquid curable composition and the surface tension of the second curable composition can be at least 0.5 mN/m, or at least 1 mN/m, or at least 5 mN/m, or at least 7 mN/m, or at least 10 mN/m.

When a certain region of the first liquid film is subjected to the first actinic radiation, the liquid film can partially cure and thereby increase its surface tension in the radiated region. In one embodiment, the at least one first region of the first film subjected to the first actinic radiation can have a surface tension SE1, and the at least one second region of the first film not subjected to the first actinic radiation can have a surface tension SE2, wherein a surface tension ratio SE1:SE2 can be at least 1.1, or at least 1.2, or at least 1.3, at least 1.5, at least 1.8, or at least 2.

As noted above, during the first actinic radiation of first regions (25) of the first film (23), an at least partial curing of the first curable composition can occur which may correspond with an increase in the viscosity. In one aspect, a viscosity ratio SV1:SV2 can be at least 1.2, or at least 1.5, or at least 2, such as at least 5, at least 10, at least 20, or at least 50, with SV1 being the viscosity of the first film in the first regions after the first actinic radiation, and SV2 being the viscosity of the first film in regions not subjected to the first actinic radiation.

When depositing drops of a second curable composition on the first film (see method step 14 in FIG. 1), depending on the location of the drops deposited on the first film, the drops can spread in a different manner.

Typically, an applied liquid film (first curable composition) on a surface of a substrate, for example, a PrepSpin material in nanoimprint lithography, can increase the spreading of the applied imprint resist drops. By changing the surface properties, viscosity and intermixing ability of the first curable liquid film in certain regions of the surface, the drop spreading can be decreased again and even changed back to the drop spreading on the substrate surface not including the pre-treatment film, or even lower. As used herein, the terms "first film" and "pre-treatment film" are used interchangeable, unless indicated otherwise.

Not being bound to theory, the decrease in drop spreading in a region of the first film subjected to actinic radiation and partial curing can be explained by an increase in the viscosity of the film in such region and thereby also a change of the surface tension and the interaction, e.g., partial intermixing, of the first film with the drops of the second liquid curable composition.

In a particular aspect, the second curable composition can be an imprint resist. The second curable composition can include polymerizable monomers, oligomers or polymers. Non-limiting examples of the second curable composition are described, for example, in US 2018/0272634, which disclosure is incorporated by reference herein.

The viscosity of the second curable composition can be not greater than 50 mPa·s, not greater than 30 mPa·s, not greater than 20 mPa·s, not greater than 15 mPa·s, or not greater than 10 mPa·s. In another aspect, the viscosity of the second curable composition can be at least 1 mPa·s, or at least 3 mPa·s, or at least 5 mPa·s.

The drop volume for depositing drops of the second curable composition on the first film depends on the desired thickness and pattern density of the cured film to be formed. In one aspect, the drop volume can be at least 0.1 pL, or at least 0.3 pL, or at least 0.5 pL, or at least 0.9 pL, or at least 1 pL. In another aspect, the drop volume may be not greater than 30 pL, or not greater than 20 pL, or not greater than 10 pL.

In one embodiment, an average drop spreading diameter of drops deposited on the at least one region 25 of the first film 23 subjected to the first actinic radiation can be SD1, and an average drop spreading diameter of drops deposited on the first film 23 in the at least one second region 28 not subjected to the first actinic radiation can be SD2, wherein the drop spreading diameter ratio SD2:SD1 can be at least 1.1, or at least 1.2, or at least 1.5, of at least 2, or at least 3, or at least 5, or at least 10. As used herein, the drop spreading diameter is the diameter of a drop deposited on the substrate surface of the tested substrate, wherein the drop diameter is measured with an optical microscope at a defined time after touching the surface of the substrate. In a particular aspect, the drop diameter can have a drop size of 0.9 pL and an optical microscope image is taken 500 ms after depositing the drop on the surface of the first layer for measuring the drop diameter.

Figure 3:
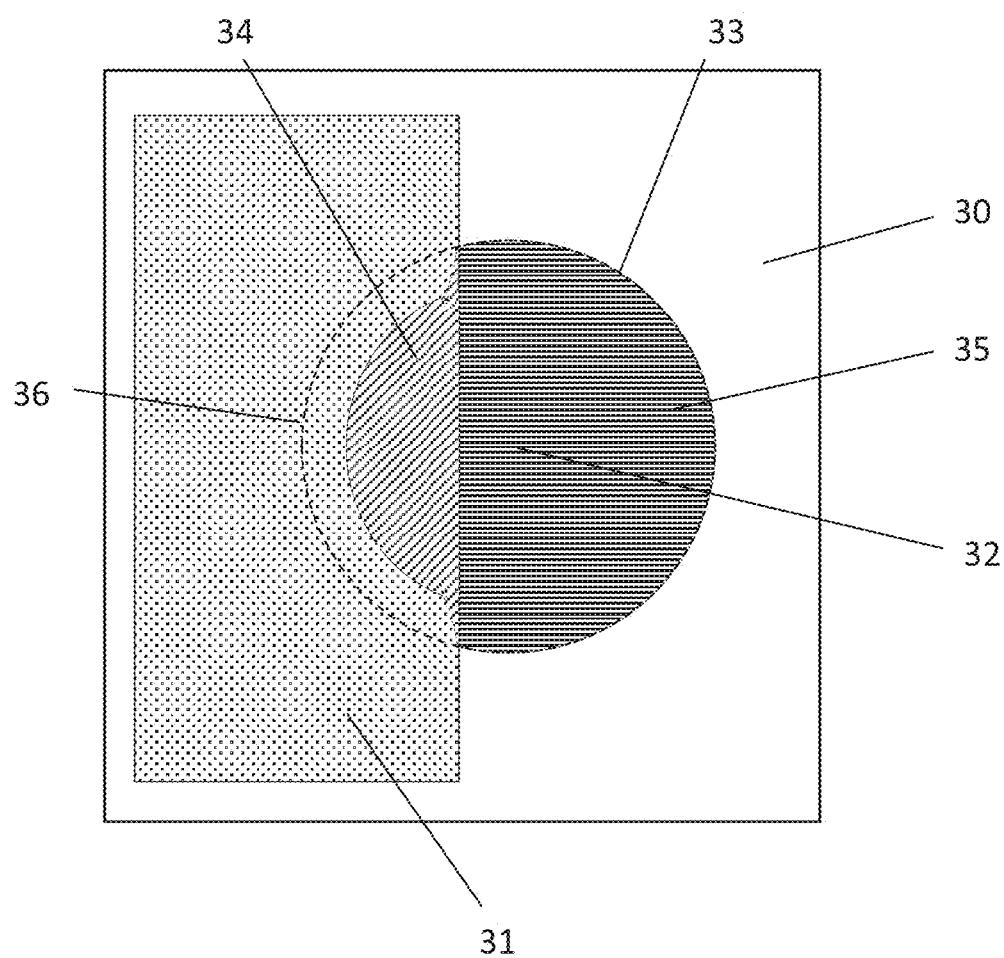
FIG. 3 illustrates a top view of a resist drop on a pre-treated substrate according to one embodiment.

FIG. 3 illustrates the spreading of an imprint resist drop on a substrate surface (30) pre-treated with a spin-coated film (herein also called first film) of a curable composition which facilitates drop spreading. The left rectangular region (31) of the substrate surface indicates a region which was exposed to UV radiation, causing partial curing of the pre-treatment film (first film) in this region (31) and thereby changing its properties, such as degree of polymerization, viscosity and surface tension. The shape of the resist drop (see solid line 33) corresponds to the shape of the drop after being placed exactly at the location (32) on the substrate and allowed to spread for a defined amount of time. The resist drop is divided into area (34), which covers the UV radiated region (31) of the substrate, and area (35), which covers the non-radiated region 30 of the substrate surface. Dashed line (36) indicates the shape of the drop if no UV treatment of region 31 would have been conducted.

It can be seen that in the region (30) which was not exposed to UV light, the drop spreads symmetrically over a larger substrate area, while in the region (31) subjected to UV radiation, the drop covers a much smaller area. Accordingly, the overall shape of the drop is asymmetric, and the spreading of this drop can be described as anisotropic.

Figure 4:
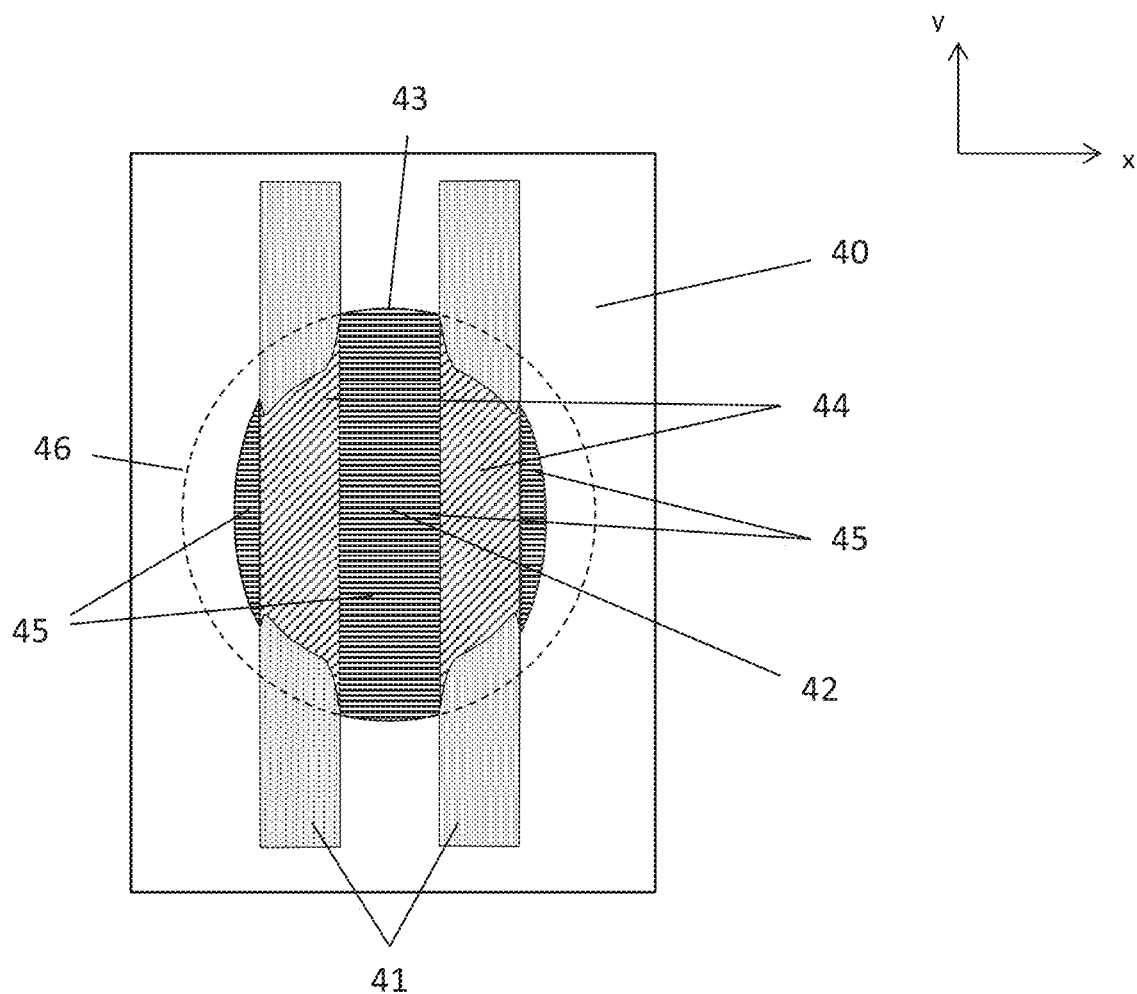
FIG. 4 illustrates a top view of a resist drop on a pre-treated substrate according to one embodiment.

FIG. 4 illustrates another embodiment of the spreading of an imprint resist drop on a substrate surface (40) pre-treated with a spin-coated film (herein also called first film) of a curable composition which facilitates drop spreading. FIG. 4 is similar to FIG. 3, except that the region subjected to UV radiation and partial curing (41) has the shape of two vertical stripes. The shape of the resist drop (see solid line 43) corresponds to the shape of the drop after being placed exactly at the location (42) on the substrate and allowed to spread for a defined amount of time. The resist drop is divided into areas (44), which cover the UV radiated region (41) of the substrate, and areas (45), which cover the non-radiated region (40) of the substrate surface. Dashed line (46) indicates the shape of the drop if no UV treatment of region (41) would have been conducted.

It can be seen that the overall shape of the resist drop is also anisotropic. In the regions not exposed to UV radiation (45), the spreading of the drop is fast and symmetric, while the surface area covered by the drop in the UV radiated regions (44) is much smaller and less even. The net result is that the drop spreads less in the direction perpendicular to the UV light exposed stripes (41), and has the tendency to spread more vertically.

Figure 5:
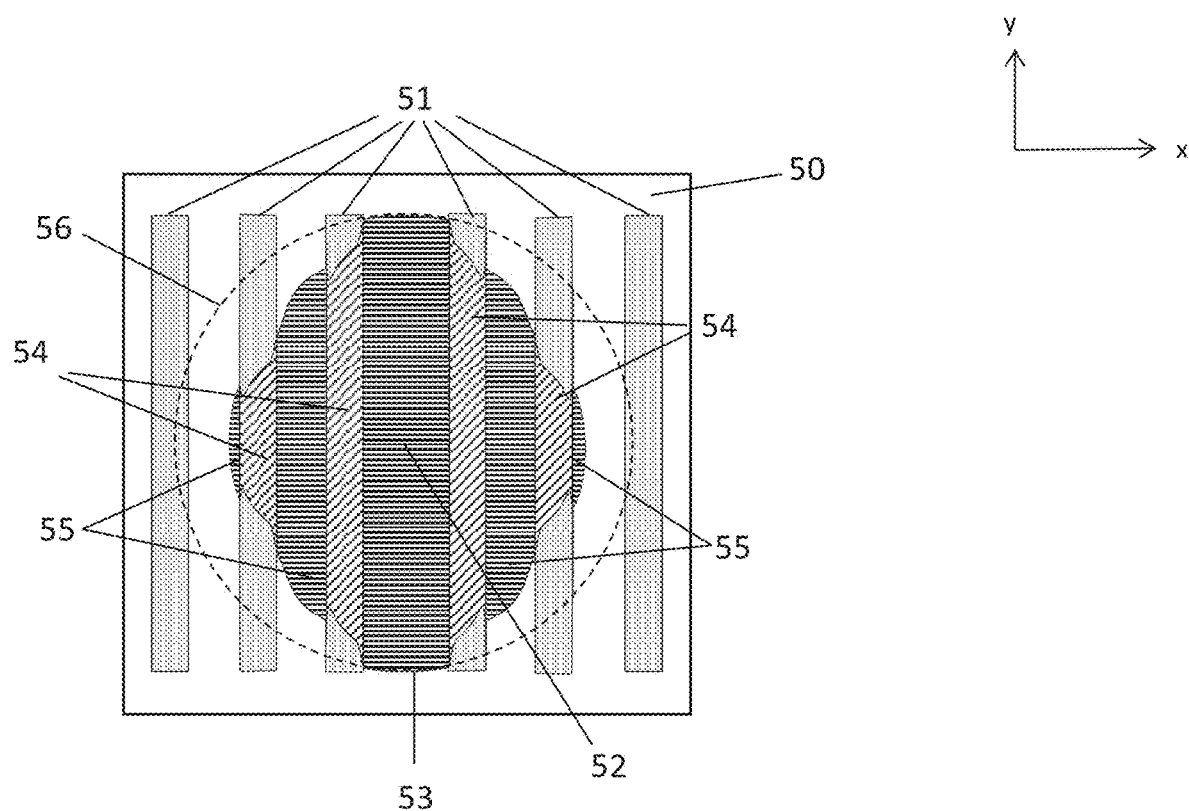
FIG. 5 illustrates a top view of a resist drop on a pre-treated substrate according to one embodiment.

FIG. 5 illustrates another embodiment of the spreading of an imprint resist drop on a substrate surface (50) pre-treated with a spin-coated film (herein also called first film) of a curable composition which facilitates drop spreading. FIG. 5 is similar to FIG. 4, except that the region subjected to UV radiation and partial curing (51) has the shape of six vertical stripes. The shape of the resist drop (see solid line 53) corresponds to the shape of the drop after being placed exactly at the location (52) on the substrate and allowed to spread for a defined amount of time. The resist drop is divided into areas (54), which cover the UV radiated regions (51) of the substrate, and areas (55), which cover the non-radiated regions (50) of the substrate surface. Dashed line (56) indicated the shape of the drop if no UV treatment of region (51) would have been conducted.

It can be seen that the overall shape of the resist drop is anisotropic. In the region not exposed to UV radiation, the spreading of the drop is faster, while the surface area covered by the drop in the UV radiated region is smaller. As soon as the drop reaches an area which was not UV radiated, however, the drop spreading changed again to a faster speed. The net result is that the drop spreads less in the direction perpendicular to the UV light exposed strips (51), and significantly reduces spreading to the left and right, and causes the resist drop to spread more in the vertical y-direction.

Figures 6A, 6B, 6C:
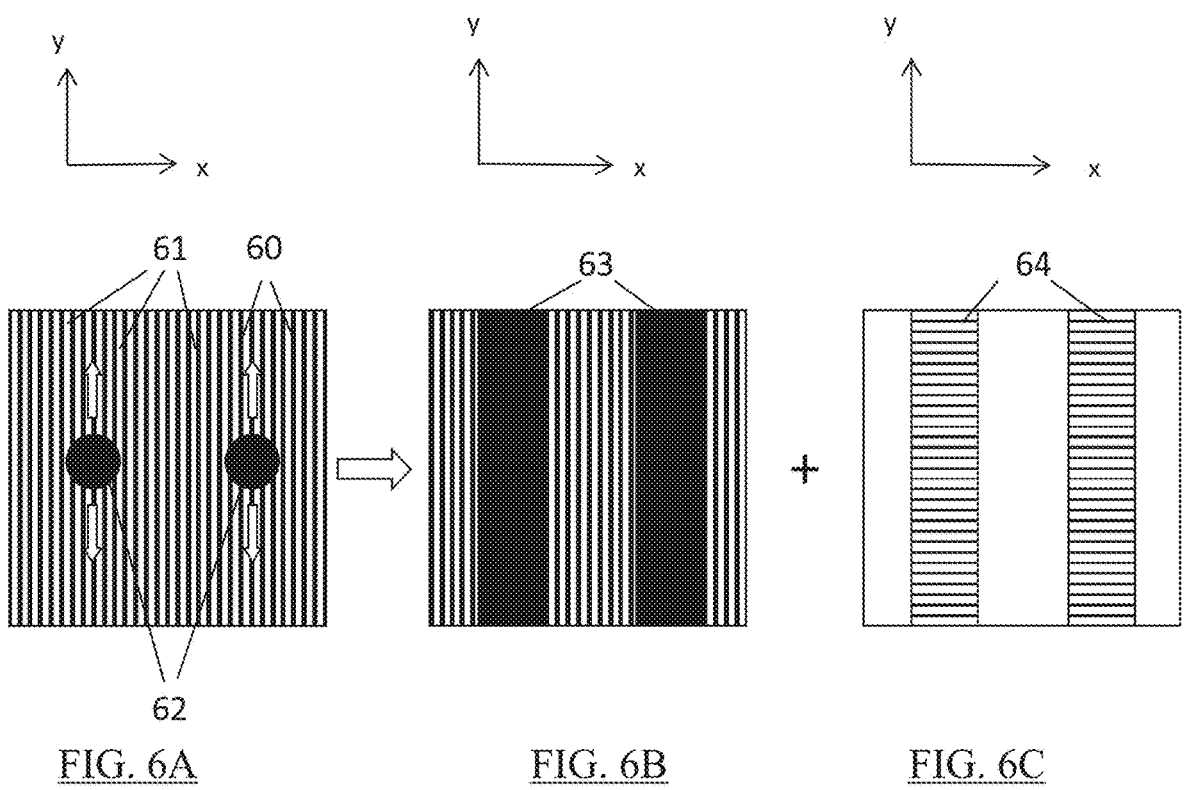
FIG. 6A illustrates a top view of two resist drops deposited on a pre-treated substrate according to one embodiment.
FIG. 6B illustrates a top view after spreading of the two resist drops shown in FIG. 6A according to one embodiment.
FIG. 6C illustrates a top view of a template designed for being applied on the spread resist drops of FIG. 6B according to one embodiment.

FIG. 6A illustrates a substrate surface pre-treated with a first film of a curable composition which facilitates resist drop spreading. The pre-treated substrate surface was exposed to UV radiation using a pattern of a plurality of equally spaced vertical stripes (61). Due to the applied pattern of alternating UV radiated stripes (61) and UV non-radiated stripes (60), imprint resist drops disposed at positions (62) on the substrate surface spread mostly vertically (y-direction) and form resist regions (63), see FIG. 6B. The shape of the spread imprint resist (63) can be of advantage if an imprint template with a pattern of horizontal stripes (64) (x-direction), as shown in FIG. 6C, is applied, which allows a fast filling of the template pattern. In this case, no resist flow would be required in the vertical direction thereby allowing a fast filling of the mask.

Figures 7A, 7B, 7C:
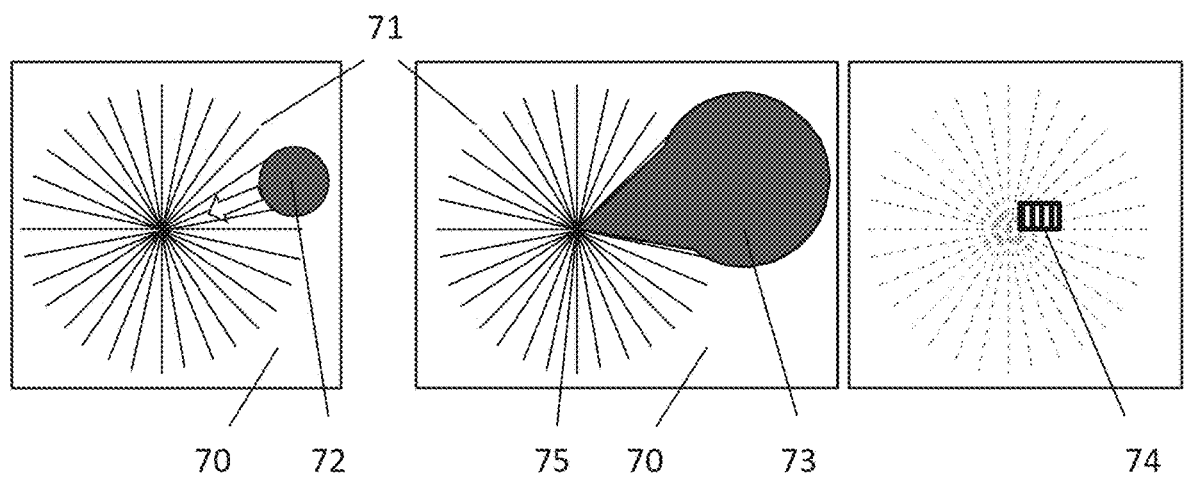
FIG. 7A illustrates a top view of a resist drop deposited on a pre-treated substrate according to one embodiment.
FIG. 7B illustrates a top view after the spreading of the resist drop illustrated in FIG. 7A according to one embodiment.
FIG. 7C illustrates a top view of a section of a template designed for being applied on the spread resist drop of FIG. 7B according to one embodiment.

FIG. 7A illustrates a substrate surface 70 pre-treated with a first film of a curable composition which facilitates resist drop spreading. The pre-treated substrate surface was exposed to UV radiation using a pattern of a vortex with diverging lines 71. Due to the line pattern, an imprint resist drop disposed at position 72 on the substrate surface can form resist region (73) which is partially pulled into the vortex center (75) (see FIG. 7B). This can bring the resist drop to the area of feature 74 (see FIG. 7C), the position where a template mask is planned to touch the substrate and being filled with the resist.

FIGS. 8A, 8B, and 8C illustrates a substrate surface pre-treated with a first film of a curable composition which facilitates resist drop spreading. The pre-treated substrate surface (80) was exposed to UV radiation with a pattern of a plurality of vertical stripes (85) combined on top with a plurality of horizontal stripes (87). An imprint resist drop disposed at position 82 can spread mostly downward along the vertical stripes (85) to form shape (83) on the substrate surface (see FIG. 8B) to cover the region where a patterned template (88) is applied and to be filled with resist (see FIG. 8C). This allows to compensate for a non-ideal position (82) of a deposited drop.

Figure 9:
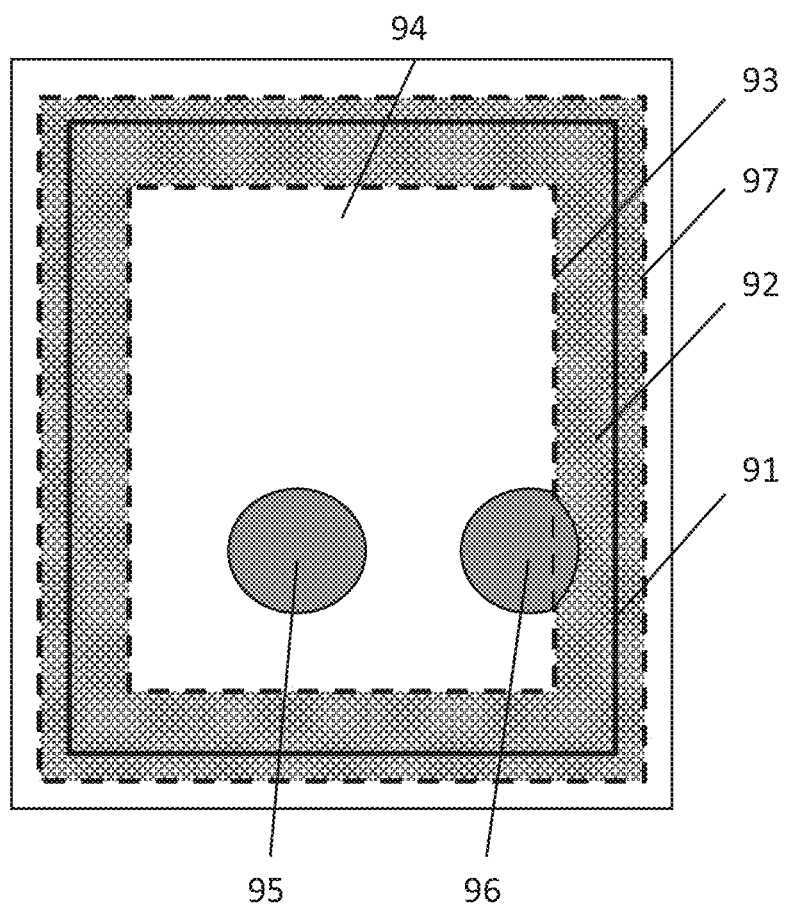
FIG. 9 illustrates a top view of two resist drops applied on a pre-treated substrate according to one embodiment.

FIG. 9 illustrates a substrate surface pre-treated with a first film of a curable composition which facilitates resist drop spreading. The pre-treated substrate surface was exposed to UV radiation only in the region (92), wherein line (93) indicates the internal border of region (92), and line (97) indicates the external border of region (92). Region (92) overlaps with the boundary region of the imprint field indicated by solid frame line (91). Pre-treated surface region (94) positioned in the center of the imprint field was not exposed to UV radiation. An imprint resist drop placed at position (95) within region (94) spreads symmetrically, leading to a round shape of the spread drop. In contrast, an imprint resist drop (96) deposited close to the internal border of region (92), spreads anisotropic since the spreading speed in the UV exposed region (92) is slower than in the region (94) not exposed to radiation and partial curing. Such setup can help the preventing of resist leakage out of boundary regions.

The present disclosure is further directed to a method of forming an article. The method can comprise forming a cured layer on a substrate as described above. The substrate and the cured layer may be subjected to additional processing to form a desired article, for example, by including an etching process to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles.

The cured layer may be further used as an interlayer insulating film of a semiconductor device, such as LSI, system LSI, DRAM, SDRAM, RDRAM, or D-RDRAM, or as a resist film used in a semiconductor manufacturing process.

As further demonstrated in the examples, it has been surprisingly discovered that by subjecting defined regions of a first curable liquid film to actinic radiation and partial curing, the drop spreading of an applied second curable composition on the surface of the first liquid film can be modified in a desired way.

EXAMPLES

The following non-limiting examples illustrate the concepts as described herein.

Example 1

A silicon substrate was coated with an about 4 nm thick first film layer of a mixture of 75 wt % tetraethylene glycol diacrylate and 25 wt % tricyclodecane dimethanol diacrylate with ethyl (2,4,6-trimethylbenzoyl) phenylphosphinate (TPO-L) as a photoinitiator.

This first film was exposed in certain regions with UV light from a HgXe lamp at an average intensity of about 13000 W/m$^2$ (measured at 310 nm) for about 100 ms under an inert gas environment.

Subsequently, about 1 pL drops of an imprint resist were dispensed on top of the first film across both the UV exposed and unexposed regions of the first film. The drops that landed on the unexposed region showed rapid, large diameter spreading. In contrast, drops deposited on the UV exposed region spread significantly less.

The imprint resist was a polymerizable composition including about 45 wt % monofunctional acrylate (isobornyl acrylate and benzyl acrylate), about 48 wt % difunctional acrylate (neopentyl glycol diacrylate), about 5 wt % photoinitiator (Darocur TPO and Darocur 4265), and about 3 wt % surfactants. The size of the resist drops was measured with an optical microscope at a time of approximately 500 ms after deposition on the first film. The analysis of the drop images showed that the average diameter of the drops that were spread in the UV unexposed region (SD2) was about 213 μm, while the average diameter size of drops in the UV exposed region (SD1) was about 109 μm. This corresponds to a drop spreading diameter ratio SD2:SD1 of 1.88.

Figure 10:
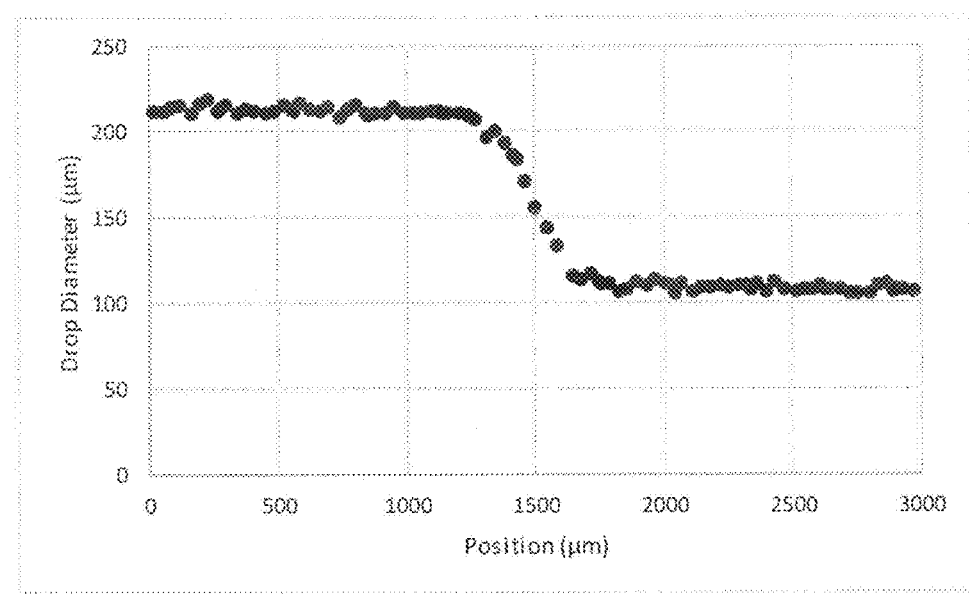
FIG. 10 includes a graph illustrating the drop diameter size depending from the position of the drop location according to one embodiment.

In the transition region, where the UV exposed region ended and the region not subjected to UV radiation started, the drop size continuously decreased over a distance of about ±100 μm from the large drop size to the small drop size, indicating an asymmetric drop spreading in this region. A graph illustrating the change in drop diameter depending from the location of the drop deposition can be seen in FIG. 10. The x axis illustrates the length direction of the substrate, wherein UV radiation was conducted at the left side, from 0 to 1500 μm, and the region from 1500 μm to 3000 μm was not subjected to UV radiation. A transition region can be seen between 1450 μm and 1550 μm wherein the drop sizes were continuously decreasing in the direction from left to right (from the average drop spreading size of 213 μm in the radiated region to the average drop size of 109 μm in the non-radiated region).

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of forming a cured layer on a substrate, comprising:
    applying a first liquid curable composition as a first film overlying an exterior surface of a substrate;
    subjecting at least one first region of the first film to a first actinic radiation, wherein the first actinic radiation causes at least a partial curing of the first liquid curable composition in the at least one first region;
    depositing droplets of a second liquid curable composition on the first film, wherein a drop spreading of the droplets is different within the at least one first region of the first film subjected to the first actinic radiation compared to at least one second region of the first film not subjected to the first actinic radiation;
    contacting the droplets deposited on the first film with a template or a superstrate to further spread and merge the droplets to a second film on the exterior surface of the substrate; and
    applying a second actinic radiation on the second film and curing the second film to form the cured layer; and
    removing the template or superstrate from the cured layer.

2. The method of claim 1, wherein at least a portion of the droplets of the second curable composition spread anisotropically along the first film overlying the exterior surface of the substrate.

3. The method of claim 1, wherein the first film is fluid when depositing the droplets of the second liquid curable composition on the first film.

4. The method of claim 1, wherein the first actinic radiation of the first film is applied through a mask containing a radiation pattern to form a plurality of at least partially polymerized first regions of the first film according to the radiation pattern.

5. The method of claim 1, wherein a viscosity of the first liquid curable composition is between 1 mPa·s and 200 mPa·s.

6. The method of claim 1, wherein the first actinic radiation is light with a wavelength in a range of 250 nm to 450 nm.

7. The method of claim 1, wherein before depositing the droplets of the second curable composition on the first film, a surface tension ratio SE1:SE2 is at least 1.1, with SE1 being a surface tension of the at least one first region of the first film subjected to the first actinic radiation, and SE2 being a surface tension of the at least one second region of the first film not subjected to the first actinic radiation.

8. The method of claim 1, wherein before depositing the droplets of the second curable composition on the first film, a viscosity ratio SV1:SV2 is at least 1.2, with SV1 being a viscosity of the at least one first region of the first film subjected to the first actinic radiation, and SV2 being a viscosity of the at least one second region of the first film not subjected to the first actinic radiation.

9. The method of claim 1, wherein the surface tension of the second curable composition is lower than the surface tension of the first curable composition.

10. The method of claim 1, wherein the first liquid curable composition comprises acrylate monomers.

11. The method of claim 1, wherein a drop spreading diameter ratio SD2:SD1 is at least 1.3, with SD2 being an average drop spreading diameter of drops deposited on the first film in the at least one second region not subjected to the first actinic radiation, and SD1 being an average drop spreading diameter of drops deposited on the at least one first region of the first film subjected to the first actinic radiation.

12. The method of claim 1, further comprising applying an adhesion layer between the exterior surface of the substrate and the first film.

13. The method of claim 1, wherein a viscosity of the second liquid curable composition is not greater than 50 mPa·s.

14. The method of claim 1, wherein the method is adapted for nanoimprint lithography and the second liquid curable composition is an imprint resist.

15. The method of claim 14, wherein the droplets deposited on the first film are contacted with a template, and wherein after removal of the template the cured layer comprises at least one imprint region and at least one boundary region, and wherein a location of the at least one imprint region on the substrate corresponds to the at least one first region of the first film subjected to the first actinic radiation, and a location of the at least one boundary region corresponds to the at least one second region of the first film not subjected to the first actinic radiation.

16. The method of claim 15, wherein the cured layer includes at least two imprint regions and at least two boundary regions.

17. The method of claim 16, wherein the at least two imprint regions and the at least two boundary regions are arranged in an alternating order.

18. The method of claim 16, wherein the at least two imprint regions form a plurality of lines and the boundary regions are arranged between the lines of the imprint regions.

19. A method of forming an article, comprising:

applying a first liquid curable composition as a first film overlying an exterior surface of a substrate;

subjecting at least one first region of the first film to a first actinic radiation, wherein the first actinic radiation causes at least a partial curing of the first liquid curable composition in the at least one first region;

depositing droplets of an imprint resist on the first film, wherein an average spreading diameter of the droplets is different within the at least one first region of the first film subjected to the first actinic radiation compared to at least one second region of the first film not subjected to the first actinic radiation;

contacting the droplets deposited on the first film with a template to further spread and merge the droplets to a second film on the exterior surface of the substrate;

subjecting the second film to a second actinic radiation and curing the second film to form a cured layer;

removing the template from the cured layer, wherein after removal of the template the cured layer comprises at least one imprint region and at least one boundary region, and wherein a location of the at least one imprint region on the substrate corresponds to the at least one first region of the first film subjected to the first actinic radiation, and a location of the at least one boundary region corresponds to the at least one second region of the first film not subjected to the first actinic radiation; and processing the substrate with the cured layer to make the article.

20. The method of claim 19, wherein the method is adapted for nanoimprint lithography and the second liquid curable composition is an imprint resist.

* * * * *